United States Patent
Francese

(10) Patent No.: US 8,405,427 B2
(45) Date of Patent: Mar. 26, 2013

(54) MULTILEVEL SLICER

(75) Inventor: Pier Andrea Francese, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 13/192,024

(22) Filed: Jul. 27, 2011

(65) Prior Publication Data

US 2013/0027088 A1    Jan. 31, 2013

(51) Int. Cl.
*H03K 5/153* (2006.01)
(52) U.S. Cl. .......................................... 327/58; 327/63
(58) Field of Classification Search ................ 327/58, 327/63, 65, 308, 538
See application file for complete search history.

(56) References Cited

U.S. PATENT DOCUMENTS

| | | | | |
|---|---|---|---|---|
| 6,144,331 A | * | 11/2000 | Jiang | 341/172 |
| 2008/0252266 A1 | * | 10/2008 | Bolz et al. | 320/166 |

OTHER PUBLICATIONS

Kim, et al., "Equalizer Design and Performance Trade-offs in ADC-based Serial Links", Rambus, Inc., Los Altos, CA, U.S.A. and Seoul National University, Seoul, Korea; copyright 2010 IEEE; pp. 1-8.
Toifl, et al., "A 22-Gb/s PAM-4 Receiver in 90-nm CMOS SOI Technology", IEEE Journal of Solid-State Circuits, vol. 41, No. 4, Apr. 2006; pp. 954-965.
Zerber, et al., "Equalization and Clock Recovery for a 2.5-10-Gb/s 2_PAM/4-PAM Backplane Transceiver Cell", IEEE Journal of Solid-State Circuits, vol. 38, No. 12, Dec. 2003; pp. 2121-2130.

* cited by examiner

*Primary Examiner* — Quan Tra
(74) *Attorney, Agent, or Firm* — Cantor Colburn LLP; Daniel Morris

(57) ABSTRACT

A circuit design configured to process a differential input signal is provided. A first floating capacitor ladder is configured to receive the positive of the differential input signal and is connected to a first switched capacitor network through phase one controlled switches. A second floating capacitor ladder configured to receive the negative of the differential input signal and is connected to a second switched capacitor network through other phase one controlled switches. A reference resistor ladder is connected to the first switched capacitor network through phase two controlled switches to provide voltage references and connected to the second switched capacitor network through other phase two controlled switches to provide the voltage references. Response to controlling the switches, the first floating capacitor ladder is configured to output first voltage thresholds to a comparator array and the second floating capacitor ladder is configured to output second voltage thresholds to the comparator array.

20 Claims, 10 Drawing Sheets

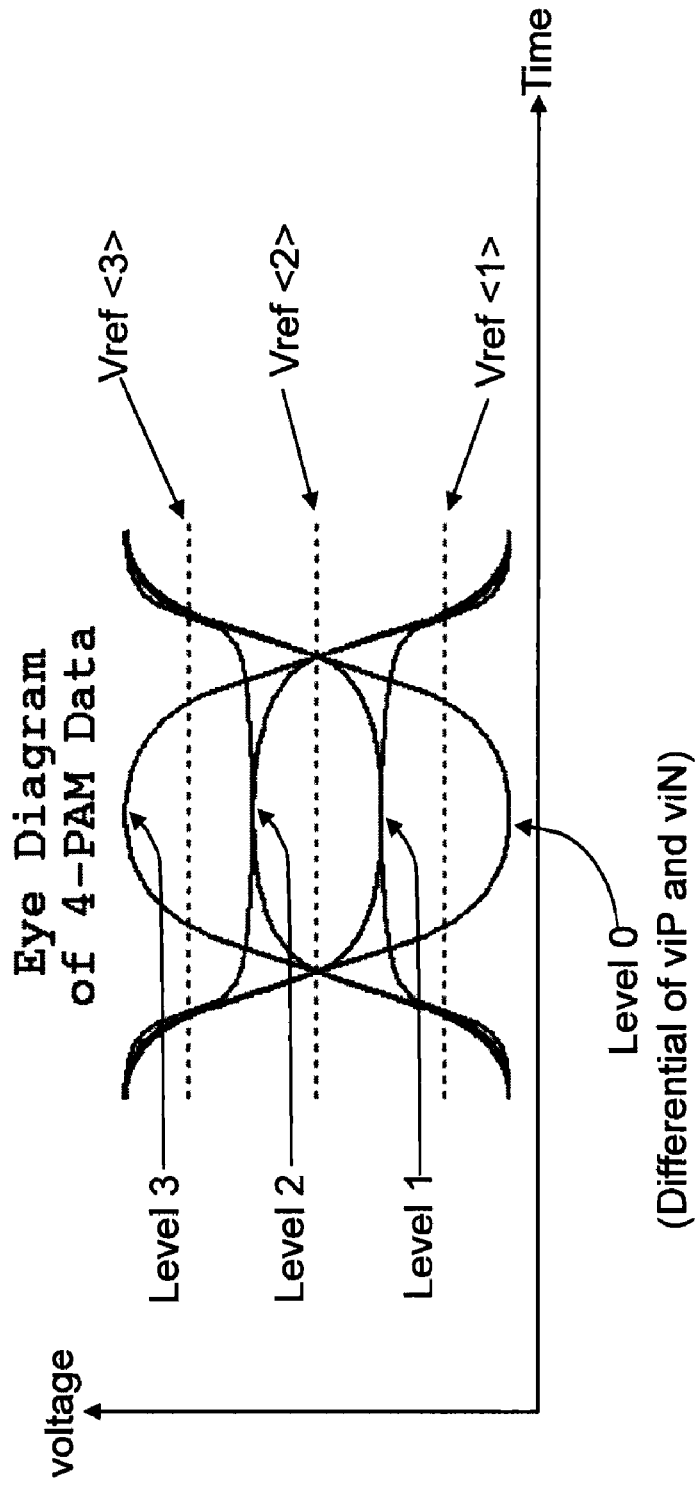

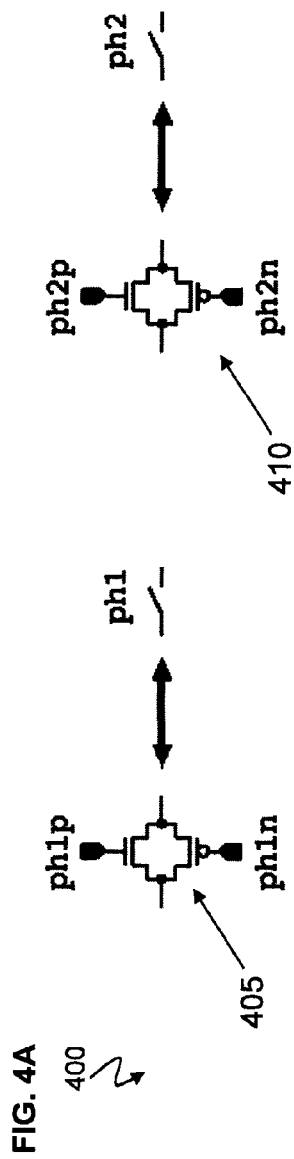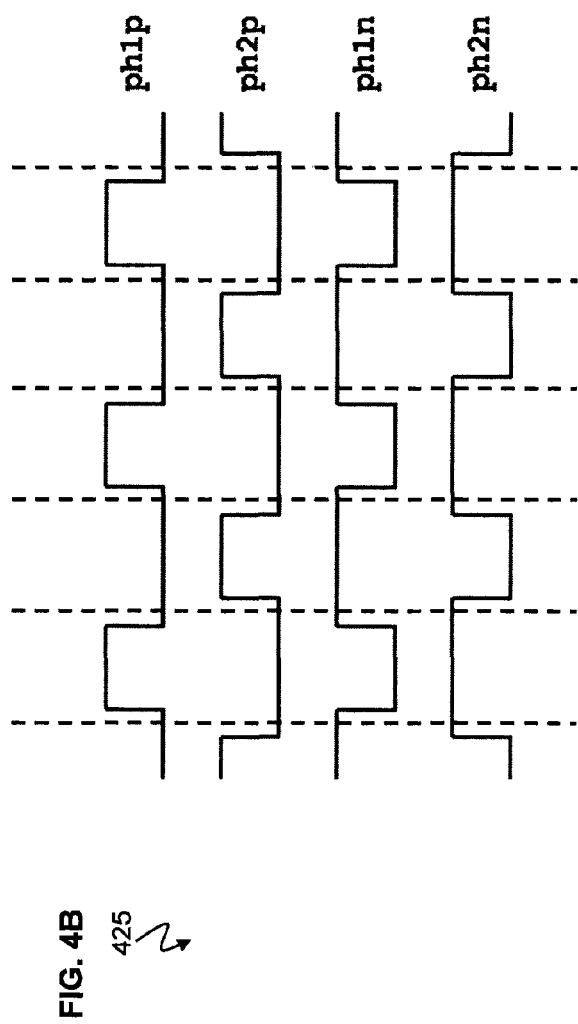
FIG. 4A
FIG. 4B

| STATE | ph1 | ph2 | vthp<3:1> denotes vthp<1>, vthp<2>, vthp<3> | vthn<3:1> denotes vthn<1>, vthn<2>, and vthn<3> |
|---|---|---|---|---|
| 0 | 0 | 0 | ALL THE SWITCHES CONTROLLED BY ph1 AND ph2 ARE OPEN. BECAUSE OF THE INITIAL CONDITION IT IS: | |
| | | | vthp<3:1>==viP | vthn<3:1>==viN |
| 1 | 0 | 1 | THE SWITCHES CONTROLLED BY ph2 ARE NOW CLOSED AND ALL THE CAPACITORS C#B# ARE CHARGED AT THE VOLTAGE DEFINED BY THE RESISTOR LADDER. | |
| 2 | 0 | 0 | ALL THE SWITCHES CONTROLLED BY ph1 AND ph2 ARE OPEN. THE VOLTAGES vthp<3:1> AND vthn<3:1> REMAIN UNCHANGED. | |
| 3 | 1 | 0 | THE SWITCHES CONTROLLED BY ph1 ARE NOW CLOSED. ALL THE CAPACITORS C#Ap AND C#Bp SHARE THEIR CHARGE. THE SAME FOR ALL THE CAPACITORS C#An AND C#Bn. THEREFORE AFTER THE CHARGE SHARING THE VOLTAGES ACROSS THE CAPACITORS ARE A WEIGHED AVERAGE OF THE VOLTAGES BEFORE THE CHARGE SHARING. | |
| 4 | 0 | 0 | ALL THE SWITCHES CONTROLLED BY ph1 AND ph2 ARE OPEN. IF ALL THE RESISTORS ARE EQUAL IT IS: $\Delta vref=vref<3>-vref<2>=vref<2>-vref<1>-vref<0>$ AND IF ALL THE CAPACITORS ARE EQUAL AND IN CASE OF IDEAL SWITCHES IT IS: | |
| | | | vthp<1>==viP+1/2 $\Delta$vref<br>vthp<2>==viP+$\Delta$vref<br>vthp<3>==viP+3/2 $\Delta$vref | vthn<1>==viN+1/2 $\Delta$vref<br>vthn<2>==viN+$\Delta$vref<br>vthn<3>==viN+3/2 $\Delta$vref |
| 5 | 0 | 1 | THE SWITCHES CONTROLLED BY ph2 ARE CLOSED ALL THE CAPACITORS C#B# ARE CHARGED BACK TO THE VOLTAGE DEFINED BY THE RESISTOR LADDER. | |
| 6 | 0 | 0 | ALL THE SWITCHES CONTROLLED BY ph1 AND ph2 ARE OPEN. THE VOLTAGES vthp<3:1> AND vthn<3:1> REMAIN UNCHANGED. | |
| 7 | 1 | 0 | THE SWITCHES CONTROLLED BY ph1 ARE CLOSED AND THE CHARGE IS SHARED. | |
| 8 | 0 | 0 | ALL THE SWITCHES CONTROLLED BY ph1 AND ph2 ARE OPEN AND UNDER THE SAME ASSUMPTIONS AS BEFORE IT IS: | |
| | | | vthp<1>==viP+3/4 $\Delta$vref<br>vthp<2>==viP+3/2 $\Delta$vref<br>vthp<3>==viP+9/4 $\Delta$vref | vthn<1>==viN+3/4 $\Delta$vref<br>vthn<2>==viN+3/2 $\Delta$vref<br>vthn<3>==viN+9/4 $\Delta$vref |
| STEADY STATE | | | BY PROCEEDING FURTHER ON THE SIGNALS TEND TO THE STEADY STATE VALUES: | |
| | | | vthp<1>==viP+1 $\Delta$vref<br>vthp<2>==viP+2 $\Delta$vref<br>vthp<3>==viP+3 $\Delta$vref | vthn<1>==viN+1 $\Delta$vref<br>vthn<2>==viN+2 $\Delta$vref<br>vthn<3>==viN+3 $\Delta$vref |

*FIG. 5*

MULTILEVEL SLICER

BACKGROUND

Exemplary embodiments relate to the field of communications, and more specifically, to processing a multilevel communication signal.

Digital communications involve conveying digital data by generating, sending, receiving, and processing analog waveforms. A transmitter accepts a sequence of digitally formatted data and converts the sequence into an analog waveform. Each time interval of this waveform carries or is encoded with an element of digital information referred to as a symbol. A one-to-one correspondence typically exists between each discrete waveform state and each symbol. That is, for the set of symbols that a communication system can convey, each symbol matches a specific signal level from two or more signal level possibilities. The transmitter outputs the waveform onto a medium or channel. The waveform transmits or propagates over the medium or channel to a receiver, which decodes or extracts the original data from the received waveform.

The transmitter generating the waveform sets the signal amplitude, phase, and/or frequency of the output waveform to one of N discrete values, levels, or states during the time interval to represent digital information. For example, binary signaling uses N=2 levels, with the levels corresponding to or representing "0" and "1". Multilevel signaling schemes can use more than two levels, i.e., N≧2, with the levels being "0", "1", . . . , "N−1". The transmitter transmits a signal level or symbol during a predetermined time period or interval called the symbol period and denoted as T0. Thus, the transmitter conveys digital data to the receiver as a sequence of symbols, while transmitting one symbol per symbol period.

On the opposite end of the communication link from the transmitter, the receiver decodes the digital information from the communicated analog waveform. That is, for each symbol, the transmitter determines or detects which of the levels was transmitted from the N possibilities. Thus, the receiver processes the incoming waveform to assign a symbol to each symbol period. If the symbol that the receiver assigns to the waveform is the same symbol that the transmitter used as the basis for modulating or generating the waveform, then the communication of that symbol succeeded, and that data element transmitted without error.

BRIEF SUMMARY

According to an exemplary embodiment, a circuit configured to process a differential input signal is provided. A first floating capacitor ladder is configured to receive the positive of the differential input signal, and the first floating capacitor ladder is connected to a first switched capacitor network through phase one controlled switches. A second floating capacitor ladder is configured to receive the negative of the differential input signal, and the second floating capacitor ladder is connected to a second switched capacitor network through other phase one controlled switches. A reference resistor ladder is connected to the first switched capacitor network through phase two controlled switches to provide voltage references, and the reference resistor ladder is connected to the second switched capacitor network through other phase two controlled switches to provide the voltage references. In response to controlling the phase one controlled switches, the other phase one controlled switches, the phase two controlled switches, and the other phase two controlled switches, the first floating capacitor ladder is configured to output first voltage thresholds to a comparator array and the second floating capacitor ladder is configured to output second voltage thresholds to the comparator array.

According to an exemplary embodiment, a receiver configured to process a differential input signal is provided. A first floating capacitor ladder is configured to receive the positive of the differential input signal, and the first floating capacitor ladder is connected to a first switched capacitor network through phase one controlled switches. A second floating capacitor ladder is configured to receive the negative of the differential input signal, and the second floating capacitor ladder is connected to a second switched capacitor network through other phase one controlled switches. A reference resistor ladder is connected to the first switched capacitor network through phase two controlled switches to provide voltage references, and the reference resistor ladder is connected to the second switched capacitor network through other phase two controlled switches to provide the voltage references. In response to controlling the phase one controlled switches, the other phase one controlled switches, the phase two controlled switches, and the other phase two controlled switches, the first floating capacitor ladder is configured to output first voltage thresholds to a comparator array and the second floating capacitor ladder is configured to output second voltage thresholds to the comparator array.

According to an exemplary embodiment, a method of processing a differential input signal is provided. The method includes configuring a first floating capacitor ladder to receive the positive of the differential input signal, where the first floating capacitor ladder is connected to a first switched capacitor network through phase one controlled switches. The method include configuring a second floating capacitor ladder to receive the negative of the differential input signal, where the second floating capacitor ladder is connected to a second switched capacitor network through other phase one controlled switches. Also, the method includes configuring a reference resistor ladder connected to the first switched capacitor network through phase two controlled switches to provide voltage references, where the reference resistor ladder is connected to the second switched capacitor network through other phase two controlled switches to provide the voltage references. In response to controlling the phase one controlled switches, the other phase one controlled switches, the phase two controlled switches, and the other phase two controlled switches, the first floating capacitor ladder is configured to output first voltage thresholds to a comparator array and the second floating capacitor ladder is configured to output second voltage thresholds to the comparator array.

Additional features are realized through the techniques of the present disclosure. Other systems, methods, apparatus, and/or computer program products according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

FIG. 3 is an eye diagram of 4-PAM (pulse amplitude modulation) data according to an exemplary embodiment.

FIG. 4A is an example of phase one and phase two switches that may be utilized in the multilevel slicer circuit according to an exemplary embodiment.

FIG. 4B is a graph of clock signals received from a processor to control the switches according to an exemplary embodiment.

FIG. 5 is a table that illustrates the evolution of positive and negative voltage thresholds from an initial condition in which all capacitors are discharged according to an exemplary embodiment.

DETAILED DESCRIPTION

Exemplary embodiments provide various implementations of circuits and circuit designs utilized as multilevel slicers in a receiver. For the basic functionality of a multilevel slicer, multilevel slicers are used in systems which require a fast comparison of an electrical input signal against a set of voltage thresholds. In particular, a multilevel slicer may be utilized in the receiver block of an I/O (input/output) link circuit designed and integrated in complementary metal-oxide-semiconductor (CMOS) technology to detect digital data transmitted using pulse amplitude modulation (PAM).

In general, a multilevel slicer has the equivalent functionality of analog to digital converters (ADC) of low to medium resolution and high conversion speed (e.g., 2-bit to 5-bit, 5 to 20 gigasamples-per-second (GSPS)). If implemented with sufficiently low power consumption (e.g. 10 mW for 4-bit 10 GSPS), such an ADC could be used in an ADC based I/O link receiver, typically in time interleaved mode and followed by a digital equalizer.

Exemplary embodiments provide techniques to design an integrated circuit which precisely generates a set of voltage references (e.g., vref<1>, vref<2>, and vref<3>) and compares the set of voltage references against a high speed differential input signal. Exemplary approaches are configured to be fully differential and scalable in the current/next technology nodes and power efficient.

In a state of the art system, the difference between the differential input signal and a set of reference voltage levels can be implemented with an array of difference differencing amplifiers (DDA) (also referred to as differential amplifiers) which commonly are realized with two cross coupled differential pairs of amplifiers (transistors). The voltage reference levels are typically generated with a ladder of resistors. The outputs of the DDA array can then be connected to an array of comparators for the detection of 4-PAM (pulse amplitude modulation) data.

In order to minimize the power consumption, the DDA and comparator functionality can be merged together in the same circuit as it is done in the designs which use offset adjustable sense amplifier latches. Also, the DDA functionality can also be merged into a level shifting amplifier before the comparator.

With respect to the state of the art multilevel slicers, techniques of exemplary embodiments disclosed herein are configured to implement the difference differencing functionality of a DDA and/or equivalent blocks in a more power efficient way and with no penalty in speed.

Figure 1:
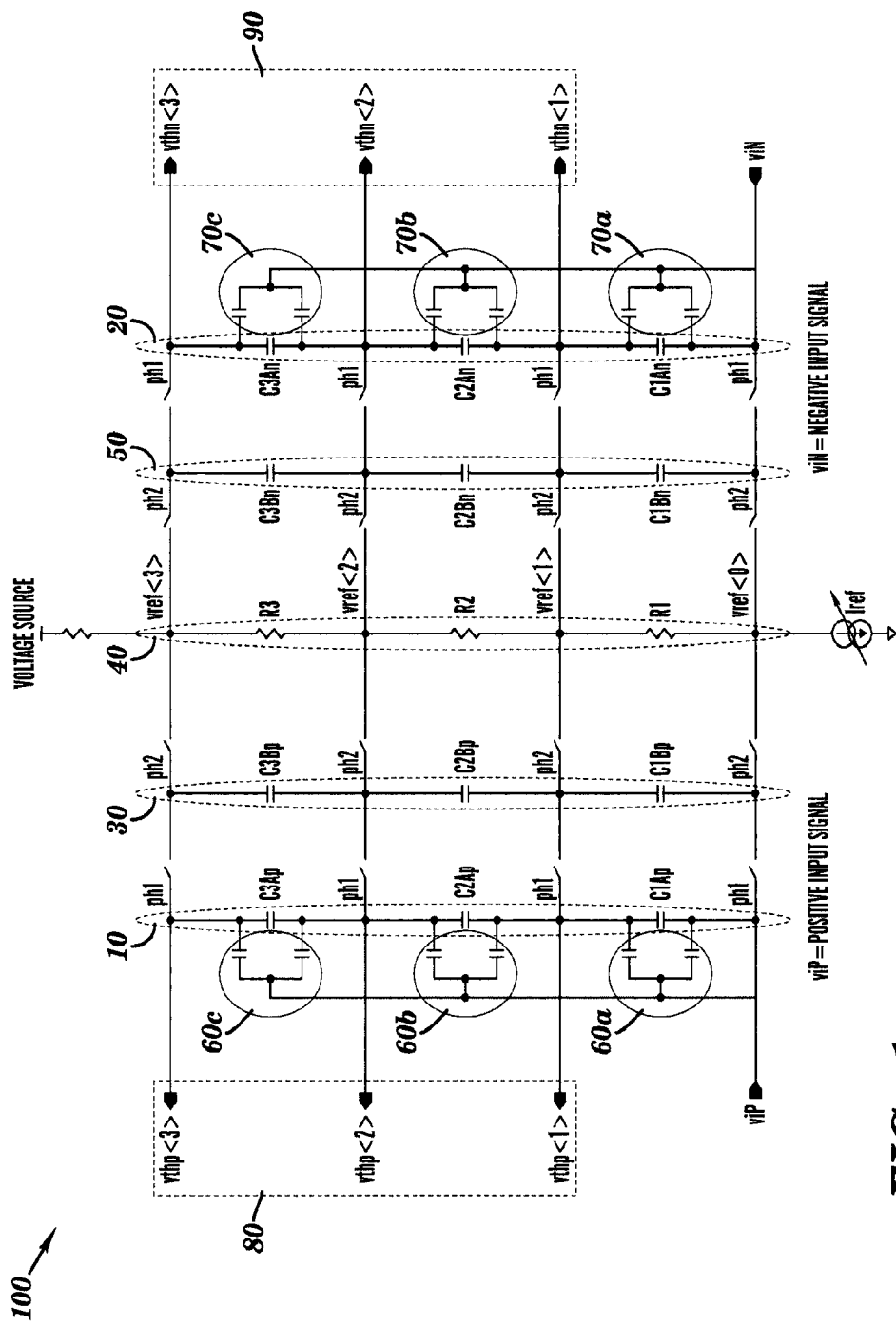
FIG. 1 is a schematic diagram for a multilevel slicer circuit utilized in a digital data receiver according to an exemplary embodiment.

Now turning to the figures, FIG. 1 is a schematic diagram of a multilevel slicer 100 utilized in a 4-PAM digital data receiver in accordance with an exemplary embodiment.

A differential input signal having positive input signal viP and negative input signal viN is received by the receiver (implemented in FIG. 1 and having the multilevel slicer 100 circuit) and input to the multilevel slicer 100. The positive input signal viP is connected to a floating capacitor ladder 10, and the negative input signal viN is connected to a floating capacitor ladder 20. The floating capacitor ladder 10 may include, e.g., capacitors C1Ap, C2Ap, and C3Ap, and the floating capacitor ladder 20 may include, e.g., capacitors C1An, C2An, and C3An.

All the capacitors in the floating capacitor ladder 10 are cyclically charged by a switched capacitor network 30 connected to a reference resistor ladder 40. All the capacitors in the floating capacitor ladder 20 are cyclically charged by a switched capacitor network 50 also connected to the reference resistor ladder 40. The switched capacitor network 30 may include capacitors C1Bp, C2Bp, and C3Bp, and the switched capacitor network 50 may include capacitors C1Bn, C2Bn, and C3Bn. The reference resistor ladder 40 may include resistors R1, R2, and R3 and is connected to a voltage source. The reference resistor ladder 40 defines the reference voltage levels vref<1>, vref<2>, and vref<3>, wherein vref<0> is not utilized to define reference voltage levels. Note that each of the capacitors (including FIGS. 6 and 8) in the floating capacitor ladders 10 and 20 and in the switched capacitor network 30 and 50 are the same (in one implementation); that is, each capacitor has the same capacitance in the floating capacitor ladder 10 and in the floating capacitor ladder 20, and each capacitor has the same capacitance in the switched capacitor network 30 and in the switched capacitor network 50 respectively; however, the capacitance between 10 and 30 may differ (in one implementation). Also, each of the resistors R1, R2, and R3 has the same resistance in the reference resistor ladder 40.

Figure 2:
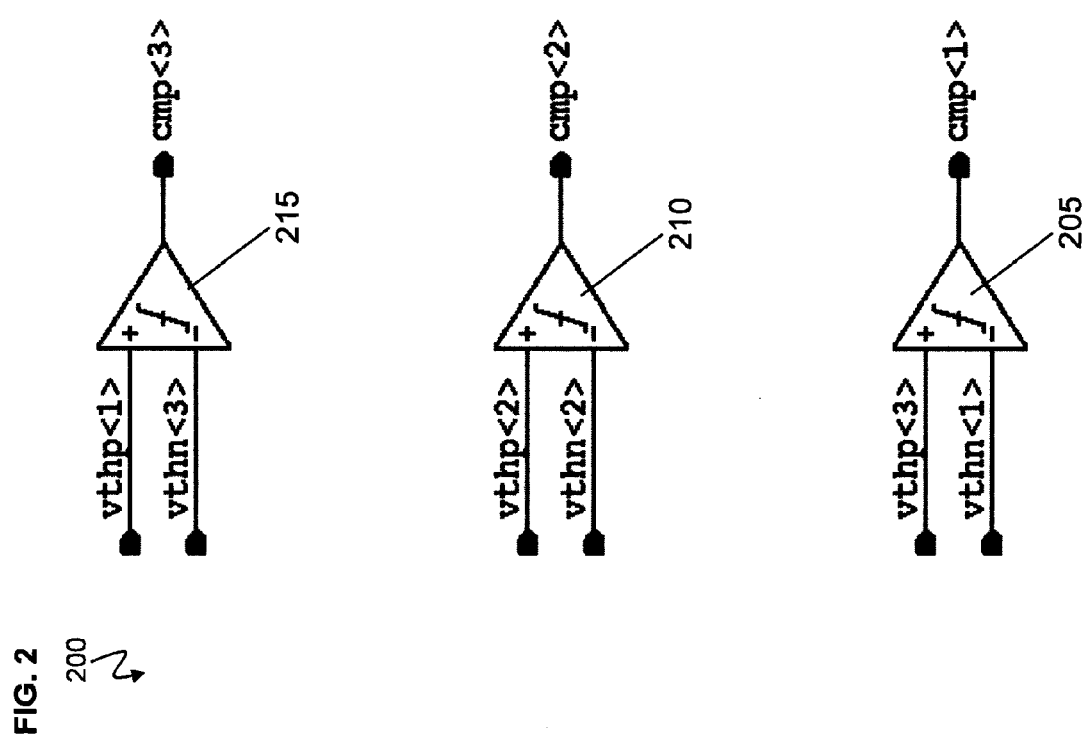
FIG. 2 is a comparator array connected during operation to the multilevel slicer circuit according to an exemplary embodiment.

As shown in FIG. 2, an array of comparators 200 (such as comparator 205, 210, and 215) is then connected in a cross differential fashion to the taps (e.g., positive voltage thresholds outputs 80) of the positive floating capacitor ladder 10 and taps (e.g., negative voltage thresholds outputs 90) of the negative floating capacitor ladder 20.

Therefore, each of the comparators 205, 210, and 215 is directly driven by the voltage difference between the inputs viP and viN and the difference between two voltage reference levels vref<1>, vref<2>, and vref<3>. Furthermore, all the comparators 205, 210, and 215 have the same common mode voltage at their inputs. The common mode (CM) voltage is the sum of the input signals common mode viCM=(viP+viN)/2 plus the difference between vref<2> and vref<0>. For example, the common mode voltage at the differential input (i.e., the positive input (+) and the negative input (−)) for comparator 215 is the following:

Common mode voltage(comparator 215)=($vthp<1>$+ $vthp<3>$)/2=($viP+viN$)/2+vref<2>−vref<0>.

If necessary the offset of each comparator 205, 210, and 215 should be calibrated (ideally at start up) by connecting the comparator 205, 210, and 215 inputs to the corresponding reference voltages of the reference resistor ladder 40.

The switched capacitor networks 30 and 50 should be implemented with minimum size CMOS transistors so that the power dissipation of the clock distribution network is minimized. Further is discussed regarding minimum size CMOS technology.

Parasitic capacitance is illustrated in FIG. 1 by parasitic capacitors 60 (generally referring to parasitic capacitors 60a, 60b, and 60c) and parasitic capacitors 70 (generally referring to parasitic capacitors 70a, 70b, and 70c). The signal attenuation/distortion caused by the voltage division between the floating capacitors (in the floating capacitor ladders 10 and 20) and the parasitic capacitance (of parasitic capacitors 60 and 70) is minimized when the bottom plates of (capacitors in) the two floating capacitor ladders 10 and 20 are directly connected to the respective input signals viP and viN; in order to improve the precision, the capacitance of such bottom plates should be designed sufficiently large. Being designed sufficiently large means designing a metal box that shields the floating capacitor ladder 10 and a metal box that shields the floating capacitor ladder 20. Also, by having the bottom plates of the floating capacitors (in the floating capacitor ladders 10 and 20) connected to the respective input signals viP and viN, the parasitic capacitors 60 do not drain capacitance (charge) from capacitors C1Ap, C2Ap, and C3Ap; likewise, the parasitic capacitors 70 do not drain capacitance (charge) from capacitors C1An, C2An, and C3An. For example, the two parasitic capacitors 60a represent the parasitic capacitance of C1Ap. The two parasitic capacitors 60a are charged by the positive input signal viP and do not drain charge (voltage) from capacitor C1Ap. The same principle (operation) applies for the other capacitors C2Ap, and C3Ap in floating capacitor ladder 20 and the capacitors C1An, C2An, and C3An in floating capacitor ladder 20 for their respective parasitic capacitors.

Referring to FIG. 1, there are switches which are respectively opened and closed according to phase 1 (ph1) and phase 2 (ph2). The switches opened according to (controlled by) phase 1 are called switches ph1, and the switches opened according to (controlled by) phase 2 are called switches ph2. When switches ph1 are open, the switches ph2 are closed. Similarly, when switches ph2 are open, the switches ph1 are closed.

Initially, the capacitors in the floating capacitor ladders 10 and 20 have no charge, and the capacitors in the switched capacitor networks 30 and 50 have no charge. When switches ph2 are closed (switches ph1 open), the capacitors in the switched capacitor networks 30 and 50 are charged to their respective voltage reference vref<1>, vref<2>, and vref<3>. When switches ph1 are closed (switches ph2 open), the capacitors in the floating capacitor ladders 10 and 20 are charged by their corresponding capacitors (connected in parallel) in the switched capacitor networks 30 and 50. An example is provided for C1Ap but applies to all capacitors in the floating capacitor ladders 10 and 20. For example, capacitor C1Ap is charged by C1Bp when switch ph1 is open and switch ph2 is closed; note that the parasitic capacitors 60a are charged by the positive input signal viP in a feed-forward fashion. Capacitor C1Ap is initially charged to half the (voltage) charge of capacitor C1Bp (leaving C1Bp at half charge (or half voltage). Capacitor C1Bp is charged again to voltage reference vref<1> when switch ph2 is closed and switch ph1 is open. Again, capacitor C1Ap is charged (to more than half the charge of C1Bp, e.g., ¾ C1Bp) by C1Bp when switch ph1 is open and switch ph2 is closed. This process continues (for all capacitors in the floating capacitor ladders 10 and 20 and switched capacitor networks 30 and 50) until the voltage and charge of capacitor C1Ap equals capacitor C1Bp at steady state. The same process applies for capacitors C2Ap, C3Ap, C1An, C2An and C3An which are respectively charged by capacitors C2Bp, C3Bp, C1Bn, C2Bn, and C3Bn (of the switched capacitor networks 30 and 50).

Referring to FIG. 2, the multilevel slicer 100 includes the comparator array 200 connected to the positive voltage threshold outputs 80 and the negative voltage threshold outputs 90 (i.e., taps). The comparator array 200 compares the inputs at the differential inputs (+ and −) and outputs a 0 or 1 at each output cmp<1>, cmp<2>, and cmp<3>. In the comparator array 200, the positive voltage threshold outputs 80 are connected to the positive (+) differential input, while the negative voltage threshold outputs 90 are connected to the negative (−) differential input. The comparators 205, 210, and 215 output a logic 0 if their respective negative differential input is higher than their positive differential input. On the other hand, the comparators 205, 210, and 215 output a logic 1 if their respective positive differential input is higher than their negative differential input. For example, if negative voltage threshold vthn<1> is greater than positive voltage threshold vthp<3>, the comparator 205 is configured to output a logic 0. Otherwise, if positive voltage threshold vthp<3> is greater than negative voltage threshold vthn<1>, the comparator 205 is configured to output a logic 1. This same comparison applies for the remaining positive and negative voltage thresholds 80 and 90 respectively input into the differential inputs of comparators 210 and 215.

FIG. 3 is an eye diagram 300 of 4-PAM (pulse amplitude modulation) data according to an exemplary embodiment. The voltage references vref<1>, vref<2>, and vref<3> are superimposed on the diagram 300 as dashed lines. The differential levels 0, 1, 2, and 3 are the difference in magnitude of the voltages of the positive and negative inputs signals viP and viN. The multilevel slicer 100 (including the comparator array 200) is utilized in a receiver to correctly identify the differential level 0, 1, 2, and 3 which are the differential input viP and viN originally transmitted to the receiver having the multilevel slicer 100 circuit. The comparators 205, 210, and 215 output cmp<1>, cmp<2>, and cmp<3>. The output cmp<1>, cmp<2>, and cmp<3> detects the differential level 0, 1, 2, and 3 (of the differential input signals viP and viN) based on the voltage references vref<1>, vref<2>, vref<3>, as determined by positive and negative voltage thresholds 80 and 90.

FIG. 4A is an example of CMOS switches 405 and 410 that may be utilized to respectively implement switches ph1 and switches ph2 in the multilevel slicer 100. For switch ph1 (corresponding to phase 1) implemented as CMOS switch 405, the CMOS switch 405 receives a clock signal ph1p and ph1n from a processor to control the gates of the CMOS switch 405. For switch ph2 (corresponding to phase 2) implemented as CMOS switch 410, the CMOS switch 410 receives a clock signal ph2p and ph2n from the processor to control the gates of the CMOS switch 410. An example of the clock signals ph1p, ph2p, ph1n, and ph2n are shown as waveforms in a graph 425 in FIG. 4B. These clock signals ph1p, ph2p, ph1n, and ph2n may be received from the clock of the processor to control the opening and closing of the switches ph1 and ph2 as discussed herein.

FIG. 5 illustrates a table 500 further describing the evolution of the positive and negative voltage threshold signals vthp<1>, vthp<2>, vthp<3>, vthn<1>, vthn<2>, and vthn<3> in the multilevel slicer 100 circuit through their steady state according to an exemplary embodiment.

In the table 500, vthp<3:1> denotes vthp<1>, vthp<2>, vthp<3>, and vthn<3:1> denotes vthn<1>, vthn<2>, and vthn<3>. Also, capacitors C#B# is generally used as a designation that represents all the capacitors in both switched capacitor networks 30 and 50. Capacitors C#Ap represent all the capacitors in the floating capacitor ladder 10, and capacitors C#Bp represent all the capacitors in the switched capacitor network 30. Capacitors C#An represent all the capacitors in the floating capacitor ladder 20, capacitors C#Bn represent all the capacitors in the switched capacitor network 50.

Figure 6:
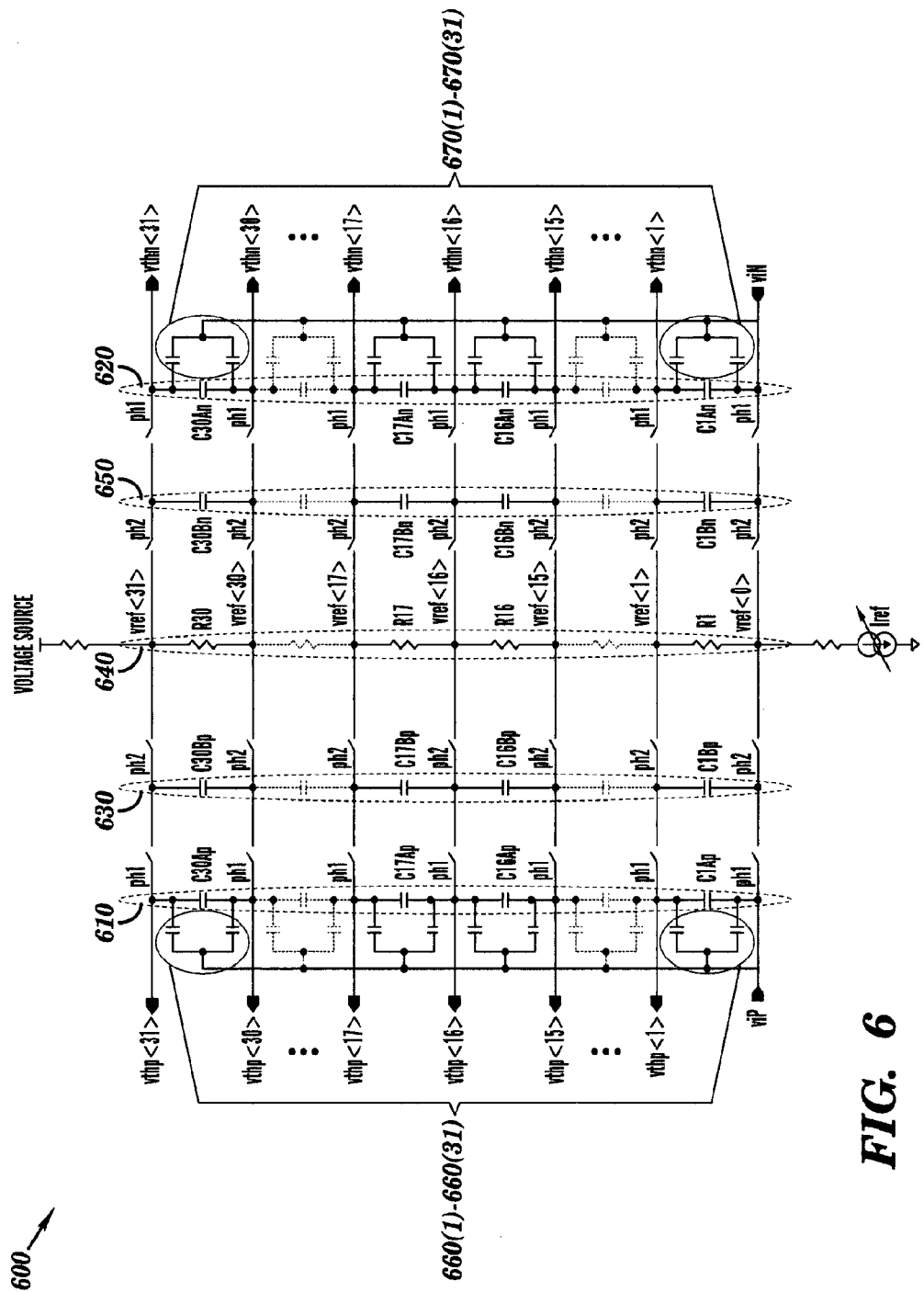
FIG. 6 is a schematic diagram for a multilevel slicer circuit utilized in a digital data receiver in which the multilevel slicer circuit operates as a 5 bit flash analog to digital converter according to an exemplary embodiment.

Now turning to FIG. 6, a schematic diagram of multilevel slicer 600 is shown as an extension to the multilevel slicer 100 according to an exemplary embodiment. The multilevel slicer 600 is a 5 bit flash ADC. The operation of the multilevel slicer 600 applies by analogy to that described for the multilevel slicer 100. However, the multilevel slicer 600 includes more circuit elements than the multilevel slicer 100. For example, the multilevel slicer 600 has 31 positive voltage thresholds vthp<1> through vthp<31>, 31 negative voltage thresholds vthn<1> through vthn<31>, 31 voltage references vref<1> through vref<31>, 30 capacitors in the floating capacitor ladder 610 (e.g., capacitors C1Ap through C30Ap), 30 capacitors in the floating capacitor ladder 620 (e.g., capacitor C1An through C30An), 30 capacitors in the switched capacitor network 630 (e.g., capacitors C1Bp through C30Bp), 30 capacitors in the switched capacitor network 650 (e.g., capacitors C1Bn through C30Bn), and 30 resistors in the reference resistor ladder 640 (e.g., resistors R1-R30). Also, the parasitic capacitance in the multilevel slicer 600 is shown as parasitic capacitors 660(1)-660(31) and 670(1)-670(31) (which are respectively configured to operate as parasitic capacitors 60a-60c and 70a-70c).

Figure 7:
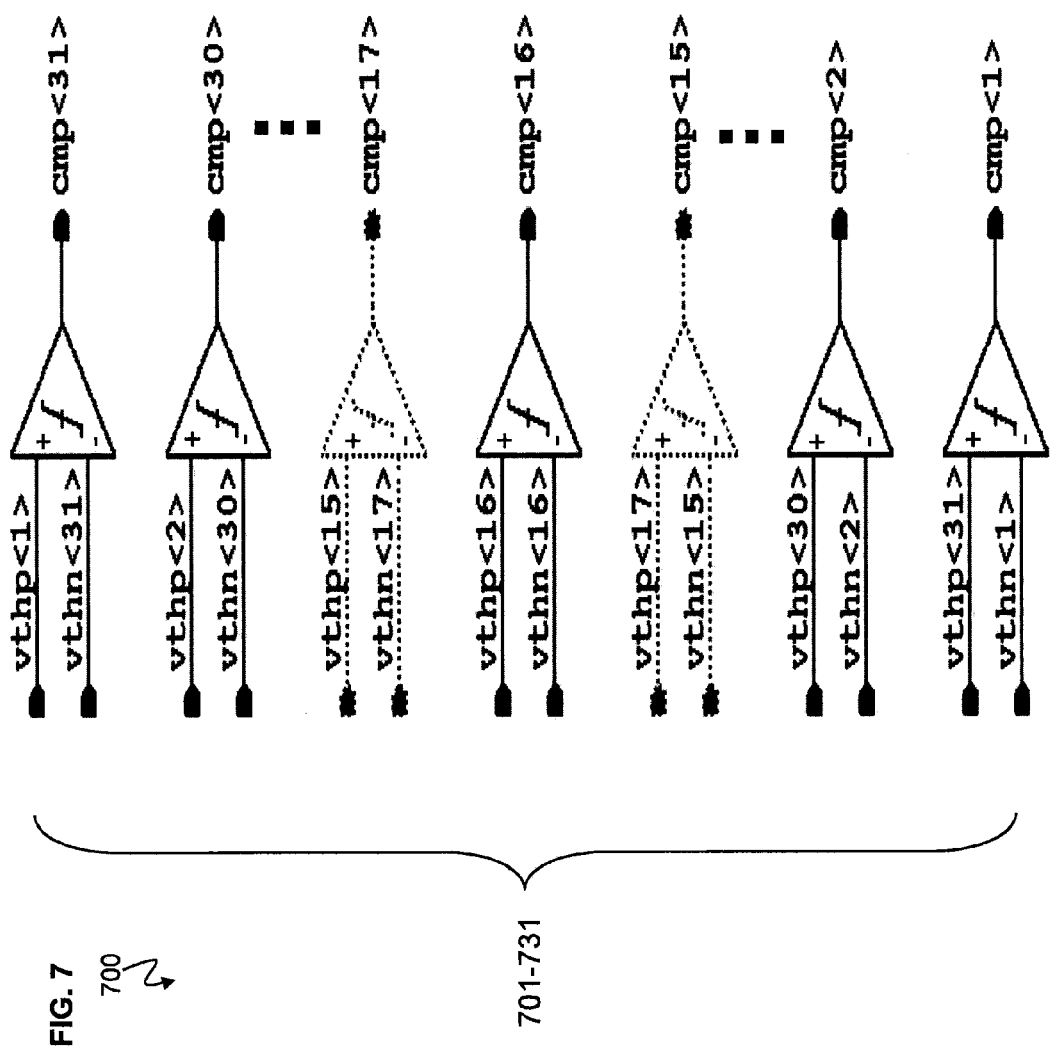
FIG. 7 is a comparator array connected during operation to the multilevel slicer circuit according to an exemplary embodiment.

As the capacitors in the floating capacitor ladder 610 and 620 are respectively charged by the capacitors in the switched capacitor network 630 and 650 (to a steady state), the positive and negative voltage thresholds outputs are respectively output to the comparator array 700 as shown in FIG. 7. The comparator array 700 has 31 comparators 701-731. The output cmp<1> through cmp<31> is utilized to determine the level of the differential input signals viP and viN.

Figure 8:
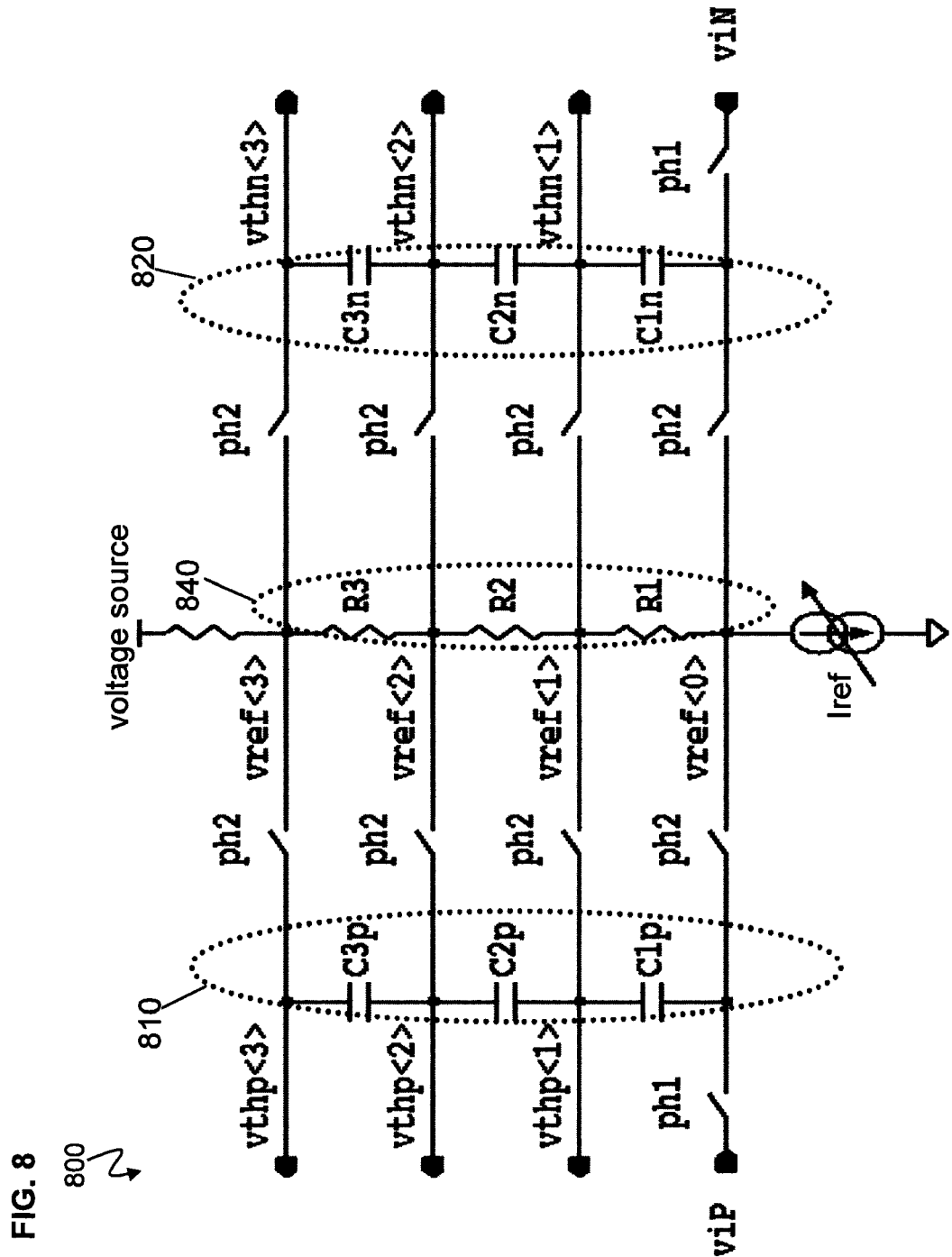
FIG. 8 is a schematic diagram of a variation for a multilevel slicer circuit utilized in a digital data receiver according to an exemplary embodiment.

FIG. 8 is a schematic diagram (i.e., circuit) of multilevel slicer 800 according to an exemplary embodiment. As one implementation, the multilevel slicer 800 is a variation of the multilevel slicer 100, and the multilevel slicer 800 also connects to the comparator array 200 shown in FIG. 2.

In FIG. 8, the input signal viP is cyclically connected to the floating capacitor ladder 810, and the differential input signal viN is cyclically connected to the floating capacitor ladder 820. Therefore, during phase ph1 (when switches ph1 are closed and switches ph2 are open) the two floating capacitor ladders 810 and 820 generate the difference between the differential input signals viP and viN and reference voltages (vthp<1>, vthp<2>, vthp<3>, vthn<1>, vthn<2>, and vthn<3>) for the comparators 205, 210, and 215 in the comparator array 200.

During phase ph2 (when switches ph2 are closed and switches ph1 are open), the differential input signals viP and viN are disconnected, and all the capacitors in the floating capacitor ladders 810 and 820 are switched to the reference resistor ladder 840 for recharging. This variation requires less components (e.g., no switched capacitor networks 30 and 50 are utilized), and therefore is simpler.

Although various implementations are provided above, it is understood that exemplary embodiments are not meant to be limited to an exact circuit configuration. Having the DDA functionality implemented with only capacitors and minimum size switches makes exemplary embodiments power efficient and scalable in the current and next generation CMOS technology nodes. Minimum size switches refer to the minimum size that capacitors can be designed given the current technology, and the minimum size may decrease as integrated circuit fabrication technology advances. For example, for minimum size transistors using 22 nanometer (nm) technology, a minimum width may be 80 nm and a minimum length may be 20 nm.

Figure 9:
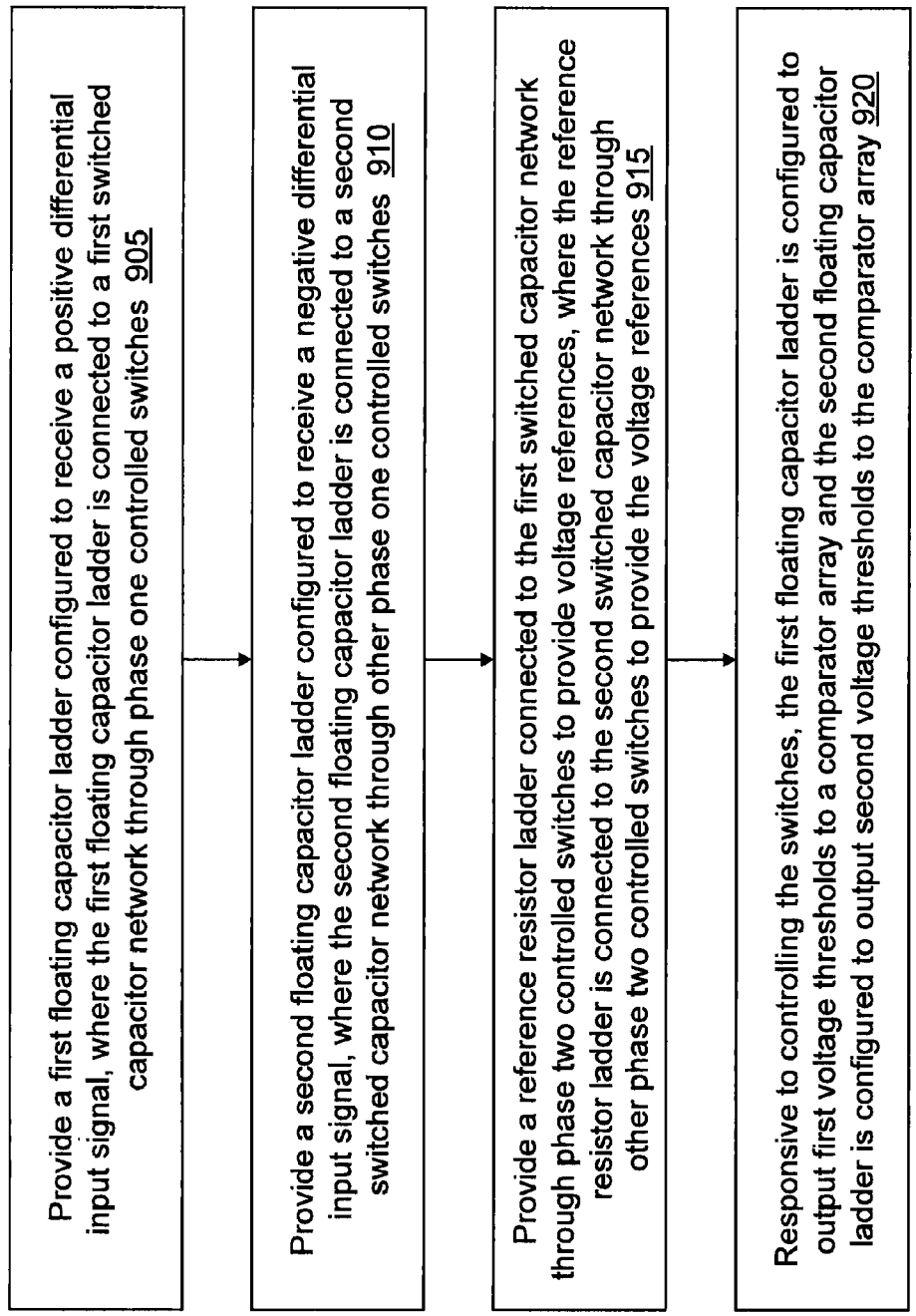
FIG. 9 illustrates a method for providing a multilevel slicer circuit according to an exemplary embodiment.

FIG. 9 illustrates a method for providing a circuit (i.e., the multilevel slicer circuit) configured to process the differential of a positive and a negative input signals viP and viN received from a transmitter. Reference can be made to FIGS. 1-8 according for various implementations.

At block 905, a first floating capacitor ladder (e.g., floating capacitor ladders 10, 610, 810) is configured to receive a positive input signal viP, in which the first floating capacitor ladder (e.g., floating capacitor ladders 10, 610, 810) is connected to a first switched capacitor network (e.g., switched capacitor networks 30, 630) through phase one controlled switches (e.g., switches ph1).

A second floating capacitor ladder (e.g., floating capacitor ladders 20, 620, 820) is configured to receive a negative input signal viN, in which the second floating capacitor ladder (e.g., floating capacitor ladders 20, 620, 820) is connected to a second switched capacitor network (switched capacitor networks 50, 650) through other phase one controlled switches (e.g., switches ph2) at block 910.

At block 915, a reference resistor ladder (e.g., reference resistor ladders 40, 640, 840) is connected to the first switched capacitor network (e.g., switched capacitor networks 30, 630) through phase two controlled switches to provide voltage references (e.g., vref<1> through vref<N>, where N is the last voltage reference), and the reference resistor ladder (e.g., reference resistor ladders 40, 640, 840) is connected to the second switched capacitor network (e.g., switched capacitor networks 50, 650) through other phase two controlled switches (e.g., switches ph2) to provide the voltage references (e.g., vref<1> through vref<N>).

In response to controlling the phase one controlled switches (switches ph1), the other phase one controlled switches (switches ph1), the phase two controlled switches (switches ph2), and the other phase two controlled switches (switches ph2), the first floating capacitor ladder (floating capacitor ladders 10, 610, 810) is configured to output first voltage thresholds (e.g., vthp<1> through vthp<N>, where N is the last voltage threshold) to a comparator array (e.g., comparator arrays 200, 700) and the second floating capacitor ladder (floating capacitor ladders 20, 620, 820) is configured to output second voltage thresholds (e.g., vthn<1> through vthn<N>, where N is the last voltage threshold) to the comparator array at block 920.

Also, in response to the phase one controlled switches and the other phase one controlled switches being open and in response to the phase two controlled switches and the other phase two controlled switches being closed, the reference resistor ladder (reference resistor ladders 40, 640, 840) is configured to charge the first switched capacitor network (switched capacitor networks 30, 630) and the second switched capacitor (switched capacitor networks 50, 650) network according to the voltage references (vref<1> through vref<N>).

The comparator array 200, 700 includes a first comparator (e.g., comparator 205, 701) through a last comparator (e.g., comparator 215, 731). The first voltage thresholds and the second voltage thresholds are differentially input to the comparator array as shown in FIGS. 2 and 7, such that the first comparator (comparator 205, 701) receives a highest voltage threshold (e.g., vthp<3>, vthp<31>) of the first voltage thresholds and receives a lowest voltage threshold (e.g., vthn<1>) of the second voltage thresholds. The last comparator (comparator 215, 731) receives a lowest voltage threshold (e.g., vthp<1>) of the first voltage thresholds and receives a highest voltage threshold (e.g., vthn<3>, vthn<31>) of the second voltage thresholds. The remaining comparators (e.g., comparator 215, comparators 702-730) in the comparator array differentially receive the first voltage thresholds in a decreasing order from the highest voltage threshold and receive the second voltage thresholds in an increasing order from the lowest voltage threshold as shown in FIGS. 2 and 7. The parasitic capacitance of capacitors (e.g., parasitic capacitors 60a-60c, 660(1)-660(31)) in the first floating capacitor ladder (floating capacitor ladders 10, 610) is charged by the positive input signal viP. The parasitic capacitance of capacitors (e.g., parasitic capacitors 70a-70c, 670(1)-670(31)) in the second floating capacitor ladder (floating capacitor ladders 20, 620) is charged by the negative input signal viN.

Figure 10:
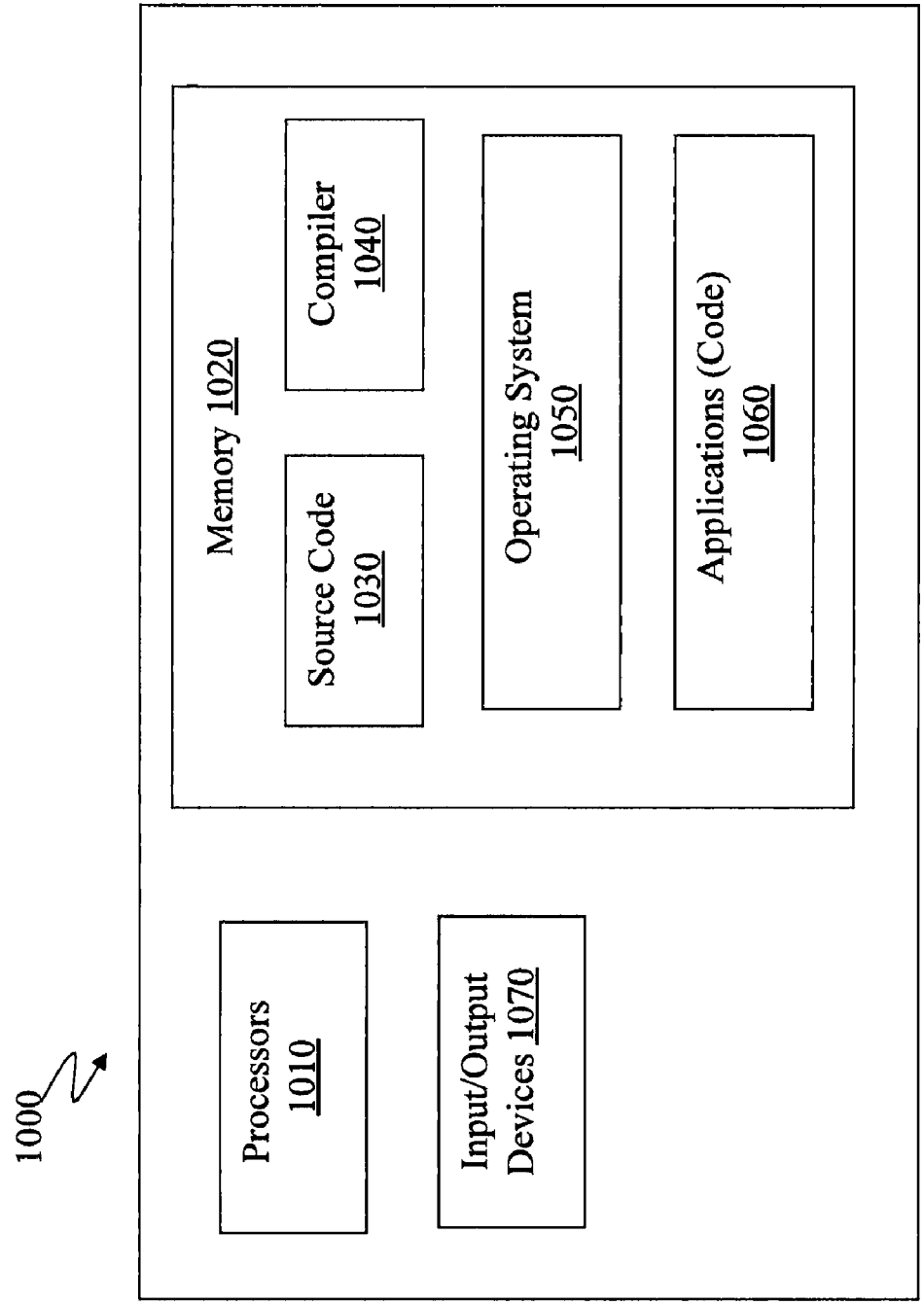
FIG. 10 depicts a computing system having features that may be utilized according to an exemplary embodiment.

FIG. 10 illustrates an example of a computer 1000 having capabilities, which may be included in exemplary embodiments. Various methods, procedures, modules, flow diagrams, elements, circuits, applications, and techniques discussed herein may also incorporate and/or utilize the capabilities of the computer 1000. Moreover, capabilities of the computer 1000 may be utilized to implement/include features of exemplary embodiments discussed herein including reference to FIGS. 1-9. One or more of the capabilities of the computer 1000 may implement any element discussed herein such as but not limited to transmitters, receivers, circuits (and circuit inputs/outputs), etc.

Generally, in terms of hardware architecture, the computer 1000 may include one or more processors 1010, computer readable storage memory 1020, and one or more input and/or output (I/O) devices 1070 that are connected for communication via a local interface (not shown). The local interface can be, for example but not limited to, one or more buses or other wired or wireless connections, as is known in the art. The local interface may have additional elements, such as controllers, buffers (caches), drivers, repeaters, transmitters, and receivers, to enable communications. Further, the local interface may include address, control, and/or data connections to enable appropriate communications among the aforementioned components.

The processor 1010 is a hardware device for executing software that can be stored in the memory 1020. The processor 1010 can be virtually any custom made or commercially available processor, a central processing unit (CPU), a data signal processor (DSP), or an auxiliary processor among several processors associated with the computer 1000.

The computer readable memory 1020 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 1020 may incorporate electronic, magnetic, optical, and/or other types of storage media. Note that the memory 1020 can have a distributed architecture, where various components are situated remote from one another, but can be accessed by the processor 1010.

The software in the computer readable memory 1020 may include one or more separate programs, each of which comprises an ordered listing of executable instructions for implementing logical functions. The software in the memory 1020 includes a suitable operating system (O/S) 1050, compiler 1040, source code 1030, and one or more applications 1060 of the exemplary embodiments. As illustrated, the application 1060 comprises numerous functional components for implementing the features, processes, methods, functions, and operations of the exemplary embodiments. Further, the application 1060 may be a source program, executable program (object code), script, or any other entity comprising a set of instructions to be performed.

The I/O devices 1070 may include input devices (or peripherals) such as, for example but not limited to, a mouse, keyboard, scanner, microphone, camera, etc. Furthermore, the I/O devices 1070 may also include output devices (or peripherals), for example but not limited to, a printer, display, etc. Finally, the I/O devices 1070 may further include devices that communicate both inputs and outputs, for instance but not limited to, a NIC or modulator/demodulator (for accessing remote devices, other files, devices, systems, or a network), a radio frequency (RF) or other transceiver (tower), a telephonic interface, a bridge, a router, etc. The I/O devices 1070 also include components for communicating over various networks, such as the internet or an intranet. The I/O devices 1070 may be connected to and/or communicate with the processor 1010 utilizing Bluetooth connections and cables (via, e.g., Universal Serial Bus (USB) ports, serial ports, parallel ports, fiber optics, FireWire, HDMI (High-Definition Multimedia Interface), etc.).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A circuit configured to process a differential input signal, comprising:

a first floating capacitor ladder configured to receive a positive of the differential input signal, the first floating capacitor ladder being connected to a first switched capacitor network through phase one controlled switches;

a second floating capacitor ladder configured to receive a negative of the differential input signal, the second floating capacitor ladder being connected to a second switched capacitor network through other phase one controlled switches; and a reference resistor ladder connected to the first switched capacitor network through phase two controlled switches to provide voltage references, the reference resistor ladder being connected to the second switched capacitor network through other phase two controlled switches to provide the voltage references;

wherein in response to controlling the phase one controlled switches, the other phase one controlled switches, the phase two controlled switches, and the other phase two controlled switches, the first floating capacitor ladder is configured to output first voltage thresholds to a comparator array and the second floating capacitor ladder is configured to output second voltage thresholds to the comparator array.

2. The circuit of claim 1, wherein in response to the phase one controlled switches and the other phase one controlled switches being open and in response to the phase two controlled switches and the other phase two controlled switches being closed, the reference resistor ladder is configured to charge the first switched capacitor network and the second switched capacitor network according to the voltage references.

3. The circuit of claim 1, wherein the comparator array comprises a first comparator through a last comparator;
wherein the first voltage thresholds and the second voltage thresholds are differentially input to the comparator array, such that the first comparator receives a highest voltage threshold of the first voltage thresholds and receives a lowest voltage threshold of the second voltage thresholds; and
wherein the last comparator receives a lowest voltage threshold of the first voltage thresholds and receives a highest voltage threshold of the second voltage thresholds.

4. The circuit of claim 3, wherein remaining comparators in the comparator array differentially receive the first voltage thresholds in a decreasing order from the highest voltage threshold and receive the second voltage thresholds in an increasing order from the lowest voltage threshold.

5. The circuit of claim 1, wherein a parasitic capacitance of capacitors in the first floating capacitor ladder is charged by the positive of the differential input signal.

6. The circuit of claim 1, wherein a parasitic capacitance of capacitors in the second floating capacitor ladder is charged by the negative of the differential input signal.

7. The circuit of claim 1, wherein the first floating capacitor ladder comprises a plurality capacitors connected in series;
wherein the second floating capacitor ladder comprises a plurality of capacitors connected in series;
wherein the first switched capacitor network comprises a plurality of capacitors connected in series, the plurality of capacitors in the first switched capacitor network being connected one-to-one in parallel to the plurality capacitors in the first floating capacitor ladder;
wherein the second switched capacitor network comprises a plurality of capacitors connected in series, the plurality of capacitors in the second switched capacitor network being connected one-to-one in parallel to the plurality capacitors in the second floating capacitor ladder; and
wherein the reference resistor ladder comprises a plurality of resistors connected in series, ones of the plurality of resistors being respectively connected to ones of the plurality of capacitors in both the first switched capacitor network and the second switched capacitor network.

8. A receiver configured to process a differential input signal, comprising:

a first floating capacitor ladder configured to receive a positive of the differential input signal, the first floating capacitor ladder being connected to a first switched capacitor network through phase one controlled switches;
a second floating capacitor ladder configured to receive a negative of the differential input signal, the second floating capacitor ladder being connected to a second switched capacitor network through other phase one controlled switches; and
a reference resistor ladder connected to the first switched capacitor network through phase two controlled switches to provide voltage references, the reference resistor ladder being connected to the second switched capacitor network through other phase two controlled switches to provide the voltage references;
wherein in response to controlling the phase one controlled switches, the other phase one controlled switches, the phase two controlled switches, and the other phase two controlled switches, the first floating capacitor ladder is configured to output first voltage thresholds to a comparator array and the second floating capacitor ladder is configured to output second voltage thresholds to the comparator array.

9. The receiver of claim 8, wherein in response to the phase one controlled switches and the other phase one controlled switches being open and in response to the phase two controlled switches and the other phase two controlled switches being closed, the reference resistor ladder is configured to charge the first switched capacitor network and the second switched capacitor network according to the voltage references.

10. The receiver of claim 8, wherein the comparator array comprises a first comparator through a last comparator;
wherein the first voltage thresholds and the second voltage thresholds are differentially input to the comparator array, such that the first comparator receives a highest voltage threshold of the first voltage thresholds and receives a lowest voltage threshold of the second voltage thresholds; and
wherein the last comparator receives a lowest voltage threshold of the first voltage thresholds and receives a highest voltage threshold of the second voltage thresholds.

11. The receiver of claim 10, wherein remaining comparators in the comparator array differentially receive the first voltage thresholds in a decreasing order from the highest voltage threshold and receive the second voltage thresholds in an increasing order from the lowest voltage threshold.

12. The receiver of claim 8, wherein a parasitic capacitance of capacitors in the first floating capacitor ladder is charged by the positive of the differential input signal.

13. The receiver of claim 8, wherein a parasitic capacitance of capacitors in the second floating capacitor ladder is charged by the negative of the differential input signal.

14. The receiver of claim 8, wherein the first floating capacitor ladder comprises a plurality capacitors connected in series;
wherein the second floating capacitor ladder comprises a plurality of capacitors connected in series;
wherein the first switched capacitor network comprises a plurality of capacitors connected in series, the plurality of capacitors in the first switched capacitor network being connected one-to-one in parallel to the plurality capacitors in the first floating capacitor ladder;
wherein the second switched capacitor network comprises a plurality of capacitors connected in series, the plurality of capacitors in the second switched capacitor network being connected one-to-one in parallel to the plurality capacitors in the second floating capacitor ladder; and wherein the reference resistor ladder comprises a plurality of resistors connected in series, ones of the plurality of resistors being respectively connected to ones of the plurality of capacitors in both the first switched capacitor network and the second switched capacitor network.

15. A method of processing a differential input signal, comprising:
  configuring a first floating capacitor ladder to receive a positive of the differential input signal, the first floating capacitor ladder being connected to a first switched capacitor network through phase one controlled switches;
  configuring a second floating capacitor ladder to receive a negative of the differential input signal, the second floating capacitor ladder being connected to a second switched capacitor network through other phase one controlled switches; and
  configuring a reference resistor ladder connected to the first switched capacitor network through phase two controlled switches to provide voltage references, the reference resistor ladder being connected to the second switched capacitor network through other phase two controlled switches to provide the voltage references;
  wherein in response to controlling the phase one controlled switches, the other phase one controlled switches, the phase two controlled switches, and the other phase two controlled switches, the first floating capacitor ladder is configured to output first voltage thresholds to a comparator array and the second floating capacitor ladder is configured to output second voltage thresholds to the comparator array.

16. The method of claim 15, wherein in response to the phase one controlled switches and the other phase one controlled switches being open and in response to the phase two controlled switches and the other phase two controlled switches being closed, the reference resistor ladder is configured to charge the first switched capacitor network and the second switched capacitor network according to the voltage references.

17. The method of claim 15, wherein the comparator array comprises a first comparator through a last comparator;
  wherein the first voltage thresholds and the second voltage thresholds are differentially input to the comparator array, such that the first comparator receives a highest voltage threshold of the first voltage thresholds and receives a lowest voltage threshold of the second voltage thresholds; and
  wherein the last comparator receives a lowest voltage threshold of the first voltage thresholds and receives a highest voltage threshold of the second voltage thresholds.

18. The method of claim 17, wherein remaining comparators in the comparator array differentially receive the first voltage thresholds in a decreasing order from the highest voltage threshold and receive the second voltage thresholds in an increasing order from the lowest voltage threshold.

19. The method of claim 15, wherein a parasitic capacitance of capacitors in the first floating capacitor ladder is charged by the positive of the differential input signal.

20. The method of claim 15, wherein a parasitic capacitance of capacitors in the second floating capacitor ladder is charged by the negative of the differential input signal.

* * * * *